(12) United States Patent
Kim

(10) Patent No.: US 8,797,093 B2
(45) Date of Patent: Aug. 5, 2014

(54) SEMICONDUCTOR INTEGRATED CIRCUIT HAVING VOLTAGE STABILIZING CIRCUIT

(75) Inventor: Jong Su Kim, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/244,169

(22) Filed: Sep. 23, 2011

(65) Prior Publication Data

US 2013/0043925 A1 Feb. 21, 2013

(30) Foreign Application Priority Data

Aug. 18, 2011 (KR) ........................ 10-2011-0082318

(51) Int. Cl.
*G05F 1/10* (2006.01)
*H01L 27/02* (2006.01)
(52) U.S. Cl.
CPC .................................. *H01L 27/0266* (2013.01)
USPC ....................................................... 327/538
(58) Field of Classification Search
CPC ................. G05F 3/262; G05F 3/265
USPC .......... 323/312, 315, 317; 327/309–314, 538, 327/540, 541, 543
See application file for complete search history.

(56) References Cited

U.S. PATENT DOCUMENTS 7,286,004 B2 * 10/2007 Inoue ........................... 327/543
2008/0197415 A1 8/2008 Yun
2009/0179590 A1 * 7/2009 Yang ........................... 315/297

* cited by examiner

*Primary Examiner* — Lincoln Donovan
*Assistant Examiner* — Sibin Chen
(74) *Attorney, Agent, or Firm* — IP & T Group LLP

(57) ABSTRACT

A semiconductor integrated circuit includes a first voltage supply unit, a second voltage supply unit configured to supply a voltage with a level different from that of the first voltage supply unit, and a voltage stabilizing unit connected between the first and second voltage supply units, and including at least one discharge path that includes a clamping section configured to temporarily drop a level of a voltage introduced from the first or second voltage supply unit, and a discharge section configured to discharge the voltage having passed through the clamping section to the second or first voltage supply unit.

17 Claims, 9 Drawing Sheets

SEMICONDUCTOR INTEGRATED CIRCUIT HAVING VOLTAGE STABILIZING CIRCUIT

CROSS-REFERENCES TO RELATED APPLICATION

The present application claims priority under 35 U.S.C. §119(a) to Korean application number 10-2011-0082318, filed on Aug. 18, 2011, in the Korean Intellectual Property Office, which is incorporated herein by reference in its entirety as set forth in full.

BACKGROUND

1. Technical Field

The present invention relates to a semiconductor integrated circuit, and more particularly, to a semiconductor integrated circuit having a voltage stabilizing circuit that requires less circuit area and discharges static electricity.

2. Related Art

A semiconductor integrated circuit that is designed for use with a power supply below 5V may be damaged or destroyed by the introduction and generation of static electricity.

In order to prevent static electricity from being introduced into a semiconductor integrated circuit, a semiconductor integrated circuit may have a static electricity protection circuit.

For example, a static electricity protection circuit may place a reverse diode between a pad and a power supply terminal to discharge static electricity. Such a reverse diode is formed by implementing a MOS transistor structure.

However, the MOS transistor type reverse diode is large in size in order to protect from damage due to static electricity. The large reverse diode size prevents an increase in a semiconductor integration density.

SUMMARY

A semiconductor integrated circuit that can reduce a circuit area and discharge static electricity is described in the following to disclosure.

In an exemplary embodiment of the present invention, a semiconductor integrated circuit includes: a first voltage supply unit; a second voltage supply unit configured to supply a voltage with a level different from that of the first voltage supply unit; and a voltage stabilizing unit connected between the first and second voltage supply units, and including at least one discharge path that includes a clamping section configured to temporarily drop a level of a voltage introduced from the first or second voltage supply unit, and a discharge section configured to discharge the voltage having passed through the clamping section to the second or first voltage supply unit.

In another exemplary embodiment of the present invention, a semiconductor integrated circuit includes: a first discharge path connected between a power voltage supply unit and a pad, and including a first clamping section connected to the pad and a first discharge section connected between the first clamping section and the power voltage supply unit; and a second discharge path connected between the pad and a ground voltage supply unit, and including a second clamping section connected to the pad and a second discharge section connected between the second clamping section and the ground voltage supply unit.

BRIEF DESCRIPTION OF THE DRAWINGS

Features, aspects, and embodiments are described in conjunction with the attached drawings, in which:

FIG. 2B is an equivalent circuit diagram of FIG. 2a;

FIG. 3B is an equivalent circuit diagram of FIG. 3a;

FIGS. 3C and 3D are plan views illustrating MOS transistors comprising the clamping section shown in FIG. 3a;

FIG. 4B is a plan view illustrating MOS transistors comprising the clamping section shown in FIG. 4a;

FIG. 6B is an equivalent circuit diagram of FIG. 6a;

FIG. 7B is an equivalent circuit diagram of FIG. 7a;

FIG. 8B is an equivalent circuit diagram of FIG. 8a.

DETAILED DESCRIPTION

Hereinafter, a semiconductor integrated circuit having a voltage stabilizing circuit according to the present invention will be described below with reference to the accompanying drawings through exemplary embodiments.

Figure 1:
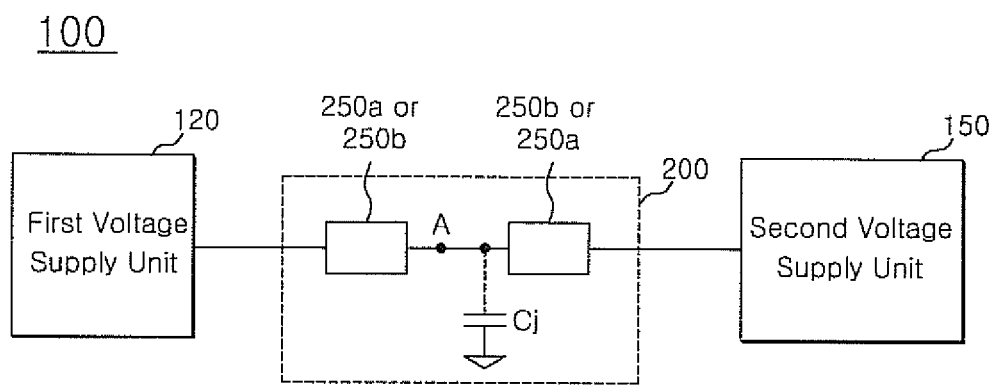
FIG. 1 is a block diagram illustrating an aspect of the present invention.

Referring to FIG. 1, a semiconductor integrated circuit 100 includes a first voltage supply unit 120, a second voltage supply unit 150, and a voltage stabilizing unit 200.

The first voltage supply unit 120 and the second voltage supply unit 150 may supply different voltage levels. For example, the first and second voltage supply units 120 and 150 may operate as a power voltage supply unit VDD, a ground voltage supply unit VSS, and a pad, which is a terminal provided with an external signal. The first and second voltage supply units 120 and 150 are selected to perform different functions.

The voltage stabilizing unit 200 is connected between the first and second voltage supply units 120 and 150. The voltage stabilizing unit 200 may include a clamping section 250a and a discharge section 250b.

The relative positions of the clamping section 250a and the discharge section 250b in the voltage stabilizing unit 200 may depend upon the voltage levels of the first and second voltage supply units 120 and 150.

Referring to FIG. 1, a connection node of the clamping section 250a and the discharge section 250b is defined as "A". The clamping section 250a may be positioned on a side of A that is connected to a power supply unit with a relatively high level, and the discharge section 250b may be positioned on a side of A that is connected to a power supply unit with a relatively low level. For example, the voltage supply with the relatively high level is the first voltage supply unit 120, and the voltage supply with the relatively low level is the second voltage supply unit 150.

For example, when a peak voltage, such as static electricity introduced from the first voltage supply unit 120, is inputted to the clamping section 250a, the clamping section 250a functions to temporarily down-buffer the peak voltage. In other words, the clamping section 250a temporarily discharges the charges and clamps the peak voltage. The clamping section 250a may include a forward diode, for example, an NMOS or PMOS transistor that is connected as a forward diode. However, the present invention is not limited to an NMOS or PMOS transistor, and a polysilicon resistor or a metal resistor may be used.

The discharge section 250b may be connected between the connection node A and the second voltage supply unit 150 and functions to discharge a buffered peak voltage. The discharge section 250b may include a reverse diode, for example, an NMOS or PMOS transistor that is connected as a reverse diode. The reference symbol Cj represents a parasitic junction capacitor that is formed in the junction region of the reverse diode. The discharge section 250b discharges the peak voltage that was first clamped by the clamping section 250a.

The discharge section 250b may remove static electricity using a small circuit area. A MOS transistor with a substantial circuit area is not used in the present invention to discharge an entire peak voltage. However, in the present invention, the clamping section 250a primarily lowers a voltage level of a peak voltage. Since a voltage and charges with a relatively low level are inputted to the discharge section 250b, static electricity may be easily discharged without using a wide circuit area.

How the semiconductor integrated circuit of the present invention may operate is described below. Although the present invention is not limited by the following descriptions, the following descriptions will assume that the voltage level of the first power supply unit 120 is higher than the voltage level of the second power supply unit 150.

As a voltage with a relatively high level, such as static electricity, is input into the clamping section 250a from the first power supply unit 120, the clamping section clamps the inputted voltage. Thereafter, the clamped voltage is discharged through the discharge section 250b.

Figure 2A:
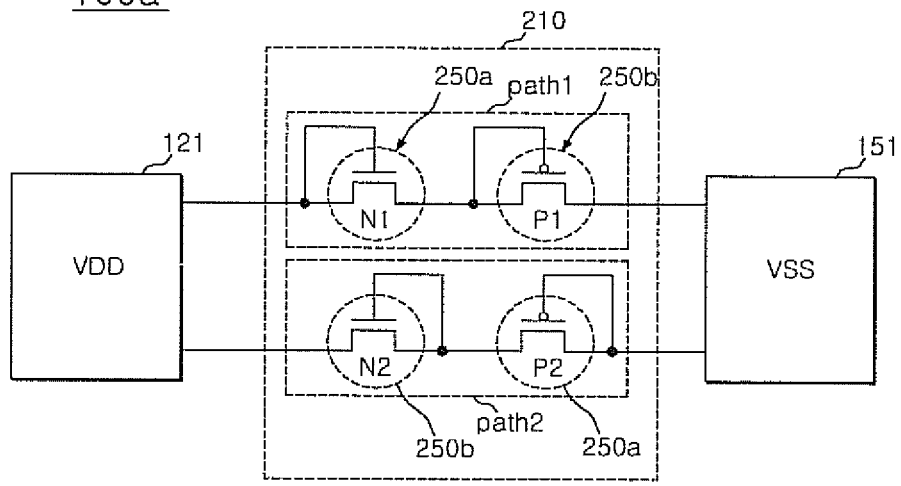
FIG. 2A is a circuit diagram illustrating a semiconductor integrated circuit having a voltage stabilizing circuit in accordance with an embodiment of the present invention.
Figure 2B:
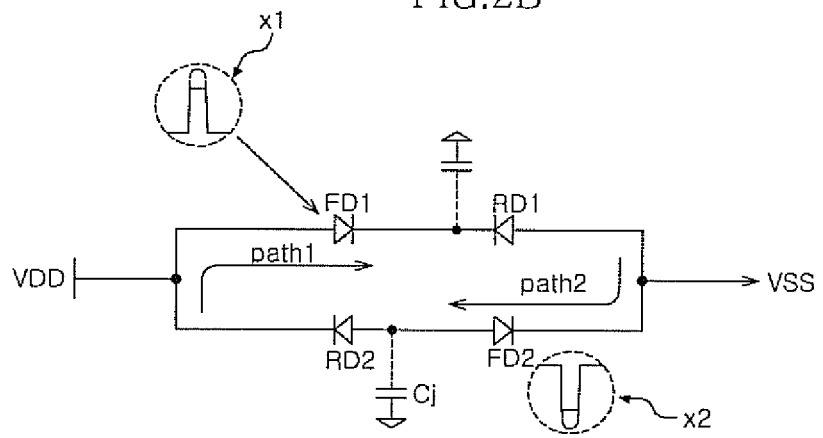
Figure 2C:
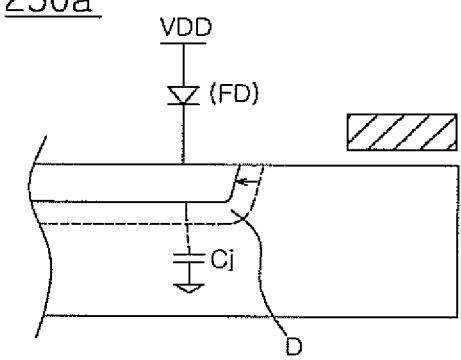
FIG. 2C is a partial cross-sectional view of the semiconductor integrated circuit, illustrating the junction capacitor in FIG. 2b.

Referring to FIGS. 2A and 2C, a semiconductor integrated circuit 100a may include a voltage stabilizing unit 210 including two discharge paths path1 and path2. The voltage stabilizing unit 210 is formed between a power voltage supply unit 121 (VDD) and a ground voltage supply unit 151 (VSS).

The voltage stabilizing unit 210 may include a first discharge path path1 and a second discharge path path2. The first discharge path path1 is configured to discharge a peak voltage inputted from the power voltage supply unit 121, and the second discharge path path2 is configured to discharge a peak voltage inputted from the ground voltage supply unit 151.

The first discharge path path1 may include a first NMOS transistor N1 functioning as a clamping section 250a and a first PMOS transistor P1 functioning as a discharge section 250b. The first NMOS transistor N1 may be connected as a forward diode to function as an actual resistor. More specifically, the first NMOS transistor N1 includes a drain that is connected to the power voltage supply unit 121, a gate that is connected to the drain, and a source that is connected to the first PMOS transistor P1. Conversely, the first PMOS transistor P1 may be connected as a reverse diode to discharge charges. More specifically, the first PMOS transistor P1 includes a source that is connected to the source of the first NMOS transistor N1, a gate that is connected to the source, and a drain that is connected to the ground voltage supply unit 151.

The second discharge path path2 may include a second NMOS transistor N2 functioning as a discharge section 250b and a second PMOS transistor P2 functioning as a clamping section 250a. In the second NMOS transistor N2, a gate and a source are connected to each other to form a reverse diode. Conversely, in the second PMOS transistor P2, a gate and a drain are connected to each other to form a forward diode.

Referring to FIG. 2b, the first discharge path path1 has an equivalent circuit where a forward diode FD1 and a reverse diode RD1 are connected between a power voltage supply unit VDD and a ground voltage supply unit VSS. In the first discharge path path1, if a voltage inputted from the power voltage supply unit VDD is peaked, a voltage drop occurs across the forward diode FD1. Accordingly, as indicated by the reference symbol x1, a peak voltage section, that is, a portion corresponding to the peak of the voltage, is clamped. Thereafter, the clamped voltage is transferred to the discharge section 250b and is then discharged.

Referring to FIG. 2C, when a tolerable voltage is applied, a depletion area D in a junction capacitor Cj gradually decreases and junction capacitance increases. If a peak voltage reaching several hundred to several thousand volts, such as static electricity, is inputted, the junction capacitor Cj is likely to be damaged. However, in the present embodiment, as the voltage with a peak voltage that has been clamped is supplied to the discharge section 250b, a depletion area D is reduced and junction capacitance increases.

The second discharge path path2 has an equivalent circuit in the type in which a reverse diode RD2 and a forward diode FD2 are connected between the power voltage supply unit VDD and the ground voltage supply unit VSS. If a voltage inputted from the ground voltage supply unit VSS peaks, the second discharge path path2 serves as a path through which the peak voltage is discharged.

The operating principle of the second discharge path path2 is the same as the operating principle of the first discharge path path1.

Figure 3A:
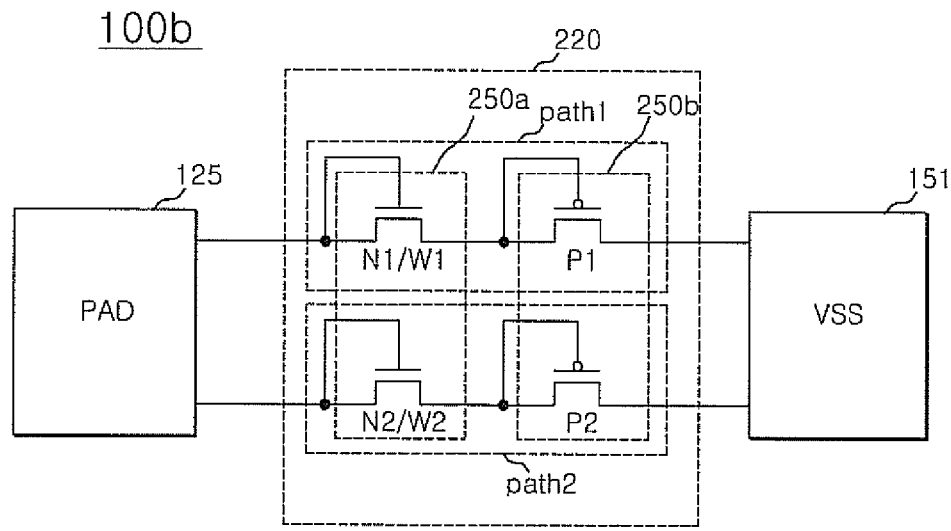
FIG. 3A is a circuit diagram showing a semiconductor integrated circuit having a voltage stabilizing circuit in accordance with another embodiment of the present invention.

Referring to FIG. 3A, the semiconductor integrated circuit 100b in accordance with the present embodiment may include a voltage stabilizing unit 220 includes a first and a second discharge path path1 and path2. The voltage stabilizing unit 220 is formed between a pad 125 and a ground voltage supply unit 151. The pad 125 may be a pad that receives data or a signal.

Figure 3B:
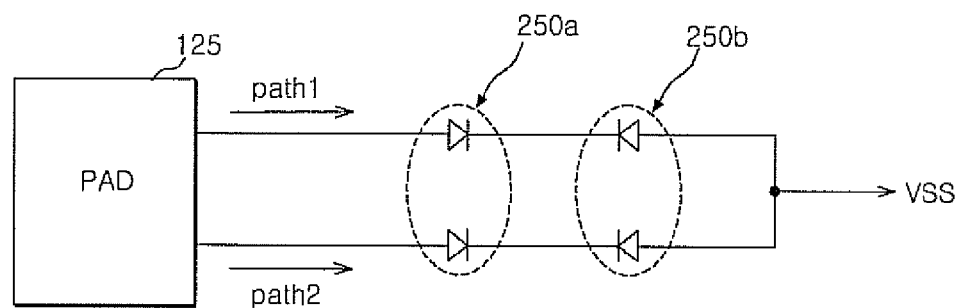

As shown in FIGS. 3A and 3B, the first and second discharge paths path1 and path2 serve as paths for discharging a peak voltage or a peak signal from the pad 125. The first and second discharge paths path1 and path2 may be configured to discharge the voltage toward the ground voltage supply unit 151. Hence, the first and second discharge paths path1 and path2 may have substantially the same configuration.

The first and second discharge paths path1 and path2 may include a clamping section 250a and a discharge section 250b. The clamping section 250a may include first and second NMOS transistors N1 and N2 functioning as a forward diode. The first and second NMOS transistors N1 and N2 are connected between the pad 125 and the discharge section 250b. The discharge section 250b may include first and second PMOS transistors P1 and P2. The first and second PMOS transistors P1 and P2 are connected between the clamping section 250a and the ground voltage supply unit 151.

In order to improve buffering efficiency, the widths of the first and second NMOS transistors N1 and N2 constituting the clamping section 250a may be different. For example, a width W1 of the first NMOS transistor N1 may be larger than a width W2 of the second NMOS transistor N2.

Leakage current increases in an NMOS transistor as its width increases. Therefore, high clamping can be achieved by increasing the widths of the first and second NMOS transistors because accelerated discharge occurs with the increased leakage current.

Figure 3C:
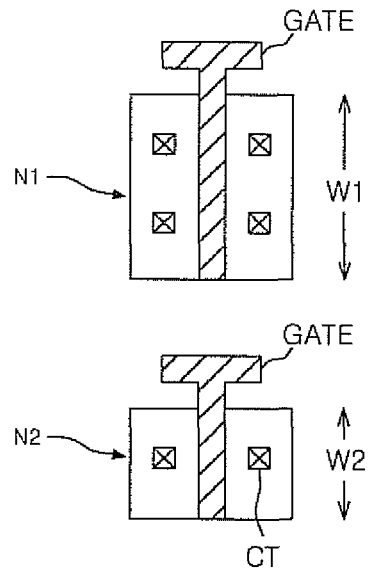
Figure 3D:
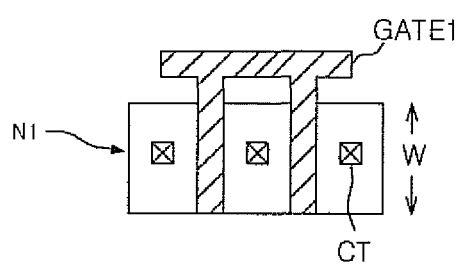
Figure 3D:
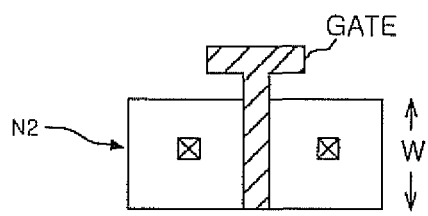

Increasing the width of a MOS transistor can be accomplished by either a method of directly increasing a width W1 of an active region (see FIG. 3C) or a method of forming a gate electrode GATE1 in a comb shape (see FIG. 3D). By forming gate electrode in a comb shape, a width W of an active region is maintained, but the effective width is increased. In FIG. 3D, a gate GATE represents a gate structure of a normal MOS transistor.

Figure 4A:
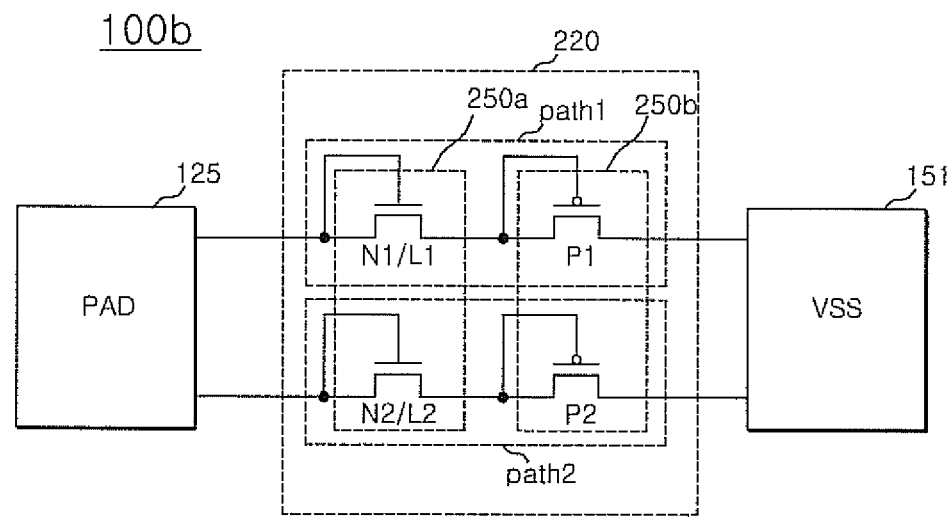
FIG. 4A is a circuit diagram illustrating a semiconductor integrated circuit having a voltage stabilizing circuit in accordance with another embodiment of the present invention.

Referring to FIG. 4A, the leakage current of the clamping section 250a may also be increased by selectively decreasing channel lengths L1 and L2 of first and second NMOS transistors N1 and N2.

Figure 4B:
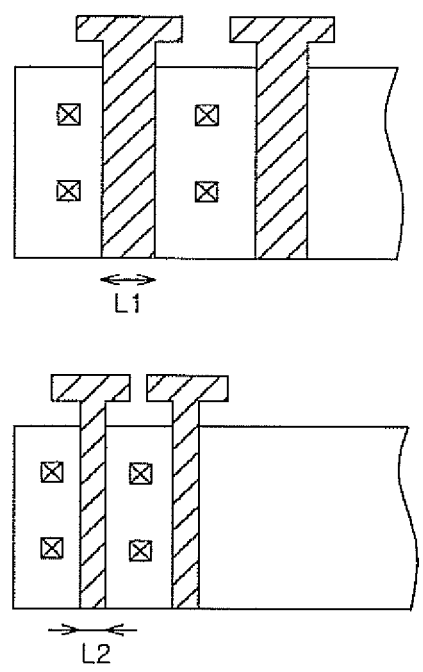

For example, referring to FIG. 4B, leakage current may be increased by designing the channel length L2 of the second NMOS transistor N2 to be narrower than a channel length L1 of the first NMOS transistor N1.

Figure 5:
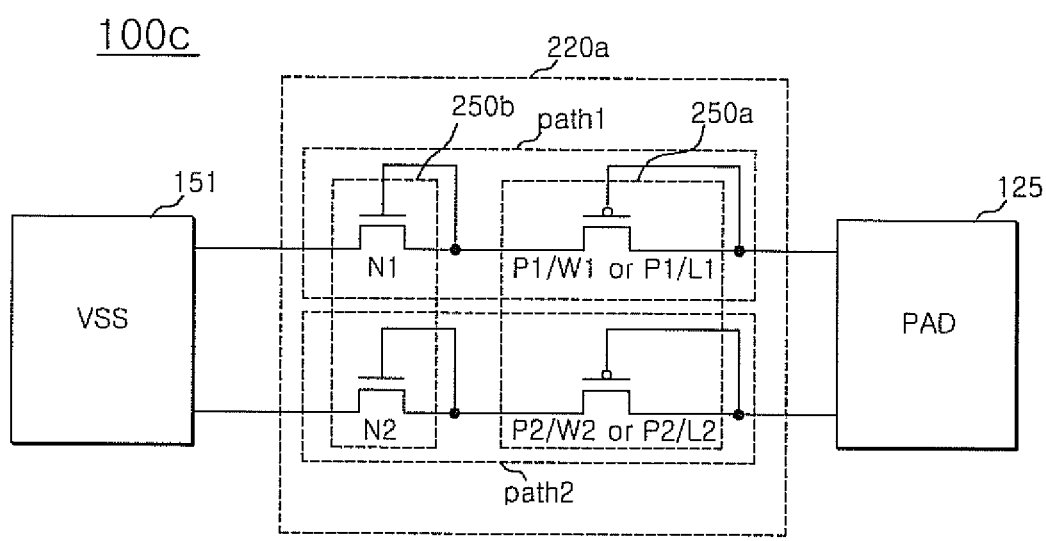
FIG. 5 is a circuit diagram illustrating a semiconductor integrated circuit having a voltage stabilizing circuit in accordance with another embodiment of the present invention.

Referring to FIG. 5, in the case where a high voltage or a peak voltage is applied to a pad 125, PMOS transistors P1 and P2 may be used as the clamping section 250a.

A semiconductor integrated circuit 100c may include a voltage stabilizing unit 220a that has first and second discharge paths path1 and path2 with the same structure between a ground voltage supply unit 151 and a pad 125.

The first and second discharge paths path1 and path2 may include a discharge section 250b and a clamping section 250a that are connected between the ground voltage supply unit 151 and the pad 125.

The discharge section 250b may include NMOS transistors N1 and N2 that are connected between the ground voltage supply unit 151 and the clamping section 250a of a corresponding discharge path. The NMOS transistors N1 and N2 may be configured as a reverse diode where a gate and a drain are connected to each other.

The clamping section 250a may include PMOS transistors P1 and P2 that are connected between the discharge section 250b of a corresponding discharge path and the pad 125. The PMOS transistors may be configured to have a gate and a source that are connected to each other to form a forward diode configuration.

As described above, the PMOS transistors P1 and P2 in the clamping section 250a may be modified in widths W1 and W2 and channel lengths L1 and L2 to increase leakage current so that buffering efficiency and clamping efficiency are increased.

Figure 6A:
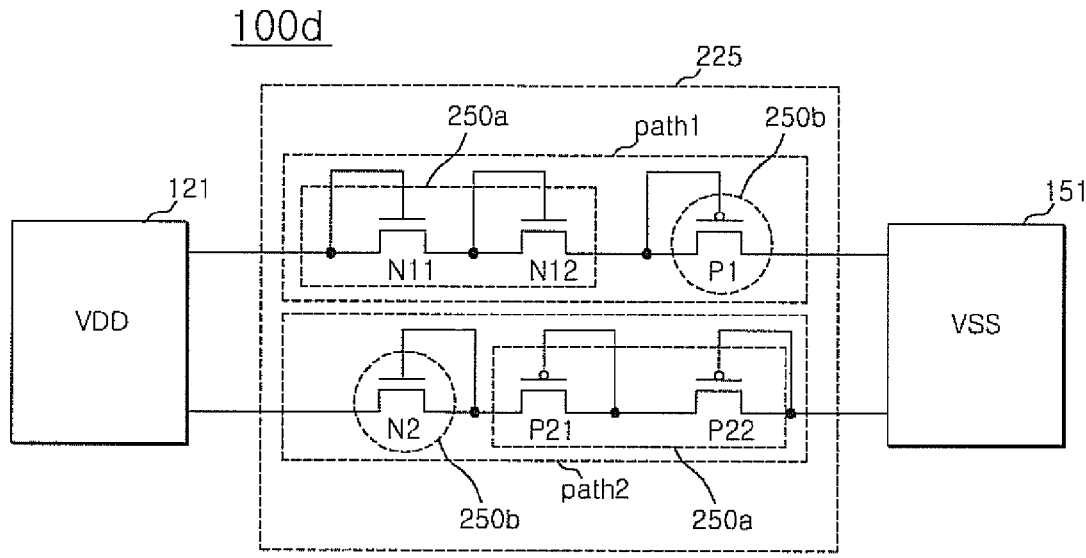
FIG. 6A is a circuit diagram illustrating a semiconductor integrated circuit having a voltage stabilizing circuit in accordance with another embodiment of the present invention.
Figure 6B:
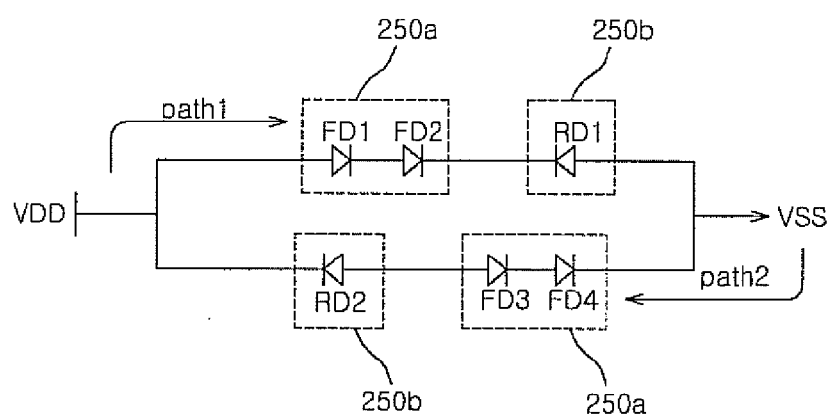

Referring to FIGS. 6A and 6B, the configurations of the clamping sections 250a of the first and the second discharge paths path1 and path2 between a power voltage supply unit 121 and a ground voltage supply unit 151 are modified from the configuration shown in FIG. 2A.

For example, in a semiconductor integrated circuit 100d, the clamping sections 250a of the first and second discharge paths path1 and path2 may include a pair of forward diodes FD1 and FD2 (or FD3 and FD4) that are connected in series.

The forward diodes FD1 and FD2 of the first discharge path path1 may include NMOS transistors N11 and N12. A gate and a drain (a junction terminal connected to VDD) are connected to each other in the NMOS transistors N11 and N12.

The forward diodes FD3 and FD4 of the second discharge path path2 may include by PMOS transistors P21 and P22. A gate and a drain (a junction terminal connected to VSS) are connected to each other in the PMOS transistors P11 and P22.

By configuring the clamping sections 250a using the forward diodes FD1 and FD2 (or FD3 and FD4) connected in series, a drop in voltage across the forward diodes may be increased.

Further, while the present embodiment described a pair of forward diodes FD1 and FD2 (or FD3 and FD4) in the clamping section 250a, connecting more than two forward diodes also falls under the scope of the present embodiment.

Figure 7A:
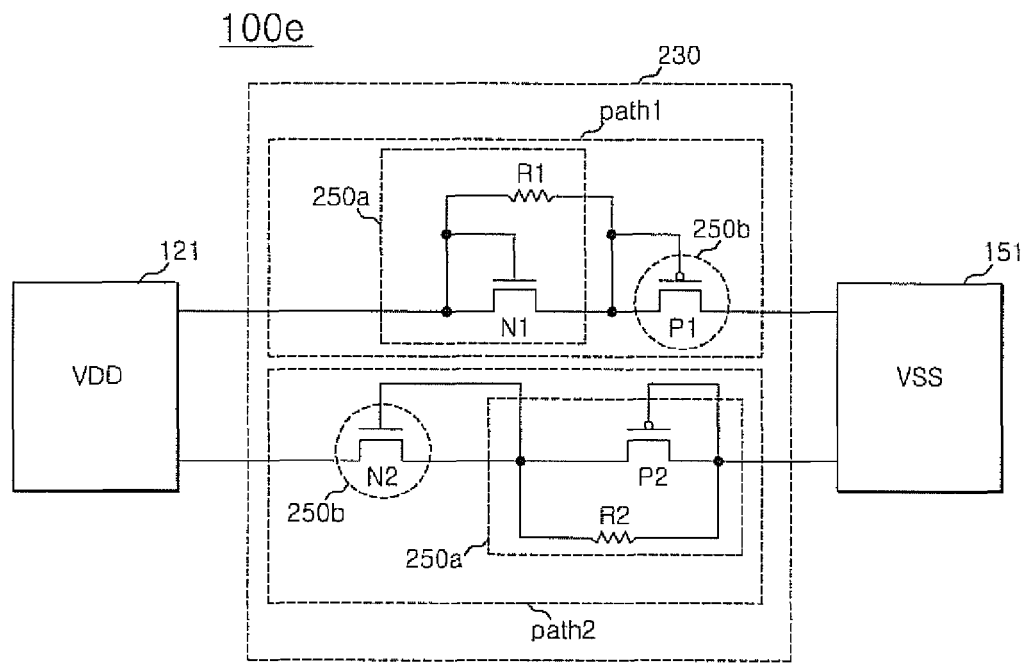
FIG. 7A is a circuit diagram illustrating a semiconductor integrated circuit having a voltage stabilizing circuit in accordance with another embodiment of the present invention.
Figure 7B:
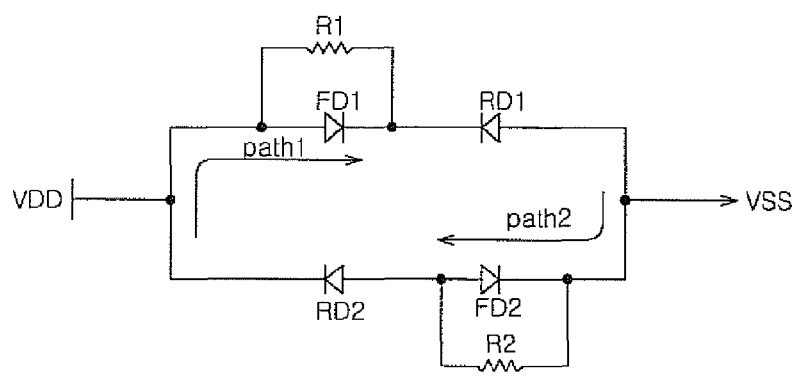

FIGS. 7A and 7B show another variation of the embodiment shown in FIG. 2a.

Referring to FIGS. 7A and 7B, a semiconductor integrated circuit 100e includes first and second discharge paths path1 and path2 each having a clamping section 250a in a voltage stabilization unit 230. Each clamping section 250a may include a forward diode FD1 or FD2 and resistors R1 or R2. The resistors R1 and R2 are connected in parallel to the forward diodes FD1 or FD2. Accordingly, the voltage drop efficiency of the clamping section 250a may be further increased.

Figure 8A:
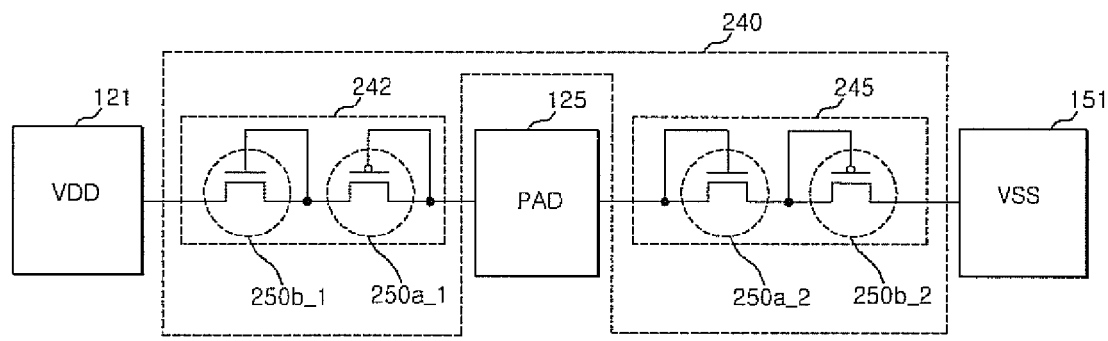
FIG. 8A is a circuit diagram illustrating a semiconductor integrated circuit having a voltage stabilizing circuit in accordance with another embodiment of the present invention.
Figure 8B:
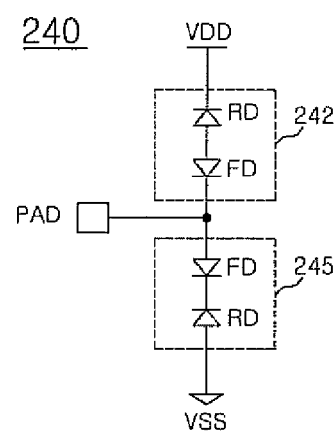

Referring to FIGS. 8A and 8B, a semiconductor integrated circuit 100f may include a power voltage supply unit 121, a pad 125, a ground voltage supply unit 151, and an incorporated voltage stabilizing unit 240.

The incorporated voltage stabilizing unit 240 may include a first discharge section 242 and a second discharge section 245.

The first discharge section 242 discharges static electricity generated between the pad 125 and the power voltage supply unit 121. The first discharge section 242 may include a first discharge part 250b_1 and a first clamping part 250a_1 that are connected between the power voltage supply unit 121 and the pad 125. The first discharge part 250b_1 may include an NMOS transistor having a gate and a source connected to each other to form a reverse diode. The first clamping part 250a_1 may include a PMOS transistor having a gate and a drain connected to each other to form a forward diode.

The second discharge section 245 is to discharge static electricity generated between the pad 125 and the ground voltage supply unit 151. The second discharge section 245 may include a second clamping part 250a_2 and a second discharge part 250b_2 that are connected between the pad 125 and the ground voltage supply unit 151. The second clamping part 250a_2 may be an NMOS transistor having a gate and a drain connected to each other. The second discharge part 250b_2 may be a PMOS transistor having a gate and a source connected to each other.

When static electricity is introduced from the pad 125, a voltage drop primarily occurs by the first or second clamping parts 250a_1 or 250a_2 that are arranged in the direction of the power voltage supply unit 121 or the ground voltage supply unit 151, depending upon the type of the static electricity. Then, final discharge is implemented by the first or second discharge parts 250b_1 or 250b_2.

According to the present invention, a voltage stabilizing circuit has a clamping section, including a forward diode configured to to primarily clamp and buffer static electricity, and a reverse diode, configured to discharge buffered and clamped static electricity, between voltage sources through which static electricity is likely to leak.

As a peak voltage, such as static electricity, is clamped to a specified level by the clamping section, a stabilized clamp voltage is provided to a discharge section. Accordingly, additional circuit area of the discharge section may not be included to remove static electricity. Thus, the area of a static electricity protection circuit may be decreased, and a semiconductor circuit may have a high integration degree.

While certain embodiments have been described above, it will be understood to those skilled in the art that the embodiments described are by way of example only. Accordingly, the semiconductor integrated circuit having a voltage stabilizing circuit described herein should not be limited based on the described embodiments. Rather, the semiconductor integrated circuit having a voltage stabilizing circuit described herein should only be limited in light of the claims that follow when taken in conjunction with the above description and accompanying drawings.

What is claimed is:

1. A semiconductor integrated circuit comprising:
   a first voltage supply unit configured to supply a voltage with a first level;
   a second voltage supply unit configured to supply a voltage with a second level different from the first level; and
   a voltage stabilizing unit connected between the first and second voltage supply units, and including at least one discharge path that includes a clamping section configured to temporarily drop a level of a voltage introduced from the first or second voltage supply unit; and
   a discharge section configured to discharge the voltage that is introduced from the first or second voltage supply unit from the clamping section to a ground terminal.

2. The semiconductor integrated circuit according to claim 1, wherein the first voltage supply unit is a power voltage supply unit, and the second voltage supply unit is a ground voltage supply unit.

3. The semiconductor integrated circuit according to claim 2, wherein the at least one discharge path of the voltage stabilizing unit comprises:
   a first discharge path configured to discharge static electricity introduced from the power voltage supply unit to the ground terminal; and
   a second discharge path configured to discharge static electricity introduced from the ground voltage supply unit to the ground terminal.

4. The semiconductor integrated circuit according to claim 3, wherein the first discharge path comprises:
   a first clamping section connected to the power voltage supply unit; and
   a first discharge section connected between the first clamping section and the ground voltage supply unit.

5. The semiconductor integrated circuit according to claim 4, wherein the second discharge path comprises:
   a second discharge section connected to the power voltage supply unit; and
   a second clamping section connected between the first discharge section and the ground voltage supply unit.

6. The semiconductor integrated circuit according to claim 1,
   wherein the clamping section includes a forward diode; and
   wherein the forward diode is formed based on a MOS transistor structure.

7. The semiconductor integrated circuit according to claim 6, wherein a plurality of forward diodes constituting the clamping section are connected in series.

8. The semiconductor integrated circuit according to claim 6, wherein the clamping section further includes a resistor that is connected in parallel to the forward diode.

9. The semiconductor integrated circuit according to claim 1, wherein the first voltage supply unit is a pad, and the second voltage supply unit is a ground voltage supply unit.

10. The semiconductor integrated circuit according to claim 9, wherein the at least one discharge path of the voltage stabilizing unit comprises first and second discharge paths configured to discharge static electricity from the pad to the ground terminal.

11. The semiconductor integrated circuit according to claim 10,
   wherein the first discharge path comprises a first clamping section connected to the pad and a first discharge section connected between the first clamping section and the ground voltage supply unit, and
   wherein the second discharge path comprises a second clamping section connected to the pad and a second discharge section connected between the second clamping section and the ground voltage supply unit.

12. The semiconductor integrated circuit according to claim 11, wherein the first and second clamping sections comprise MOS transistors that are connected in a forward diode type.

13. The semiconductor integrated circuit according to claim 12, wherein the MOS transistor constituting the first clamping section has larger leakage current than the MOS transistor constituting the second clamping section.

14. the semiconductor integrated circuit according to claim 12, wherein a width of the MOS transistor constituting the first clamping section is larger than a width of the MOS transistor constituting the second clamping section.

15. The semiconductor integrated circuit according to claim 12, wherein a channel length of the MOS transistor constituting the first clamping section is shorter than a channel length of the MOS transistor constituting the second clamping section.

16. A semiconductor integrated circuit comprising:
   a first discharge path connected between a first voltage supply unit, configured to supply a voltage with a first level, and a second voltage supply unit, configured to supply a voltage with a second level different from the first level, the first discharge path including a first forward diode, connected to the first voltage supply unit, and a first reverse diode, connected between the forward diode and the second voltage supply unit; and
   a second discharge path connected between the second voltage supply unit and the first voltage supply unit, the second discharge path including a second forward diode, connected to the second voltage supply unit, and a second reverse diode, connected between the second forward diode and the first voltage supply unit;
   wherein the first forward diode and the second forward diode are configured to temporarily drop a level of a voltage introduced from an input node, and
   wherein the first reverse diode and the second reverse diode are configured to discharge a voltage that is discharged from the first forward diode or the second forward diode to a ground terminal.

17. The semiconductor integrated circuit according to claim 16, wherein the first level is higher than the second level.

* * * * *